(12) United States Patent
Ngo et al.

(10) Patent No.: US 6,727,176 B2
(45) Date of Patent: Apr. 27, 2004

(54) METHOD OF FORMING RELIABLE CU INTERCONNECTS

(75) Inventors: Minh Van Ngo, Fremont, CA (US); Arvind Halliyal, Cupertino, CA (US); Eric Paton, Morgan Hill, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/986,267

(22) Filed: Nov. 8, 2001

(65) Prior Publication Data

US 2003/0087522 A1 May 8, 2003

(51) Int. Cl.$^7$ ............................................... H01L 21/44
(52) U.S. Cl. ...................... 438/660; 438/662; 438/687; 438/632
(58) Field of Search .................. 438/632, 646, 438/660, 662, 663, 687

(56) References Cited

U.S. PATENT DOCUMENTS

| | | | |
|---|---|---|---|
| 6,153,522 A | 11/2000 | Takagi et al. | |
| 6,165,894 A | 12/2000 | Pramanick et al. | |
| 6,174,810 B1 * | 1/2001 | Islam et al. | 438/687 |
| 6,261,963 B1 * | 7/2001 | Zhao et al. | 438/704 |
| 6,281,104 B1 | 8/2001 | Batra et al. | |
| 6,368,967 B1 * | 4/2002 | Besser | 438/687 |
| 6,391,777 B1 * | 5/2002 | Chen et al. | 438/687 |
| 6,417,100 B1 * | 7/2002 | Avanzino et al. | 438/648 |
| 6,440,844 B1 * | 8/2002 | Takagi et al. | 438/637 |
| 2002/0000271 A1 * | 1/2002 | Ritzdorf et al. | 148/518 |

FOREIGN PATENT DOCUMENTS

EP            751566 A2 *  1/1997

* cited by examiner

Primary Examiner—Amir Zarabian
Assistant Examiner—Jamie L. Brophy

(57) ABSTRACT

Reliable Cu interconnects are formed by filling an opening in a dielectric layer with Cu and then laser thermal annealing in $NH_3$ to reduce copper oxide and to reflow the deposited Cu, thereby eliminating voids and reducing contact resistance. Embodiments include laser thermal annealing employing an $NH_3$ flow rate of about 200 to about 2,000 sccm.

15 Claims, 4 Drawing Sheets

METHOD OF FORMING RELIABLE CU INTERCONNECTS

TECHNICAL FIELD

The present invention relates to copper (Cu) and/or Cu alloy metallization in semiconductor devices, particularly to a method for forming reliable Cu or Cu alloy interconnects, such as single and dual damascene structures in low dielectric constant materials. The present invention is particularly applicable to manufacturing high speed integrated circuits having submicron design features and high conductivity interconnects with improved electromigration resistance.

BACKGROUND ART

The escalating demand for high density and performance impose severe requirements on semiconductor fabrication technology, particularly interconnection technology in terms of providing a low R×C (resistance×capacitance) interconnect pattern with electromigration resistance wherein submicron vias, contacts and trenches have high aspect ratios. Conventional semiconductor devices comprise a semiconductor substrate, typically doped monocrystalline silicon, and a plurality of sequentially formed interlayer dielectrics and conductive patterns. An integrated circuit is formed containing a plurality of conductive patterns comprising conductive lines separated by interwiring spacings, and a plurality of interconnect lines, such as bus lines, bit lines, word lines and logic interconnect lines. Typically, the conductive patterns on different layers, i.e., upper and lower layers, are electrically connected by a conductive plug filling a via hole, while a conductive plug filling a contact hole establishes electrical contact with an active region on a semiconductor substrate, such as a source/drain region. Conductive lines are formed in trenches which typically extend substantially horizontal with respect to the semiconductor substrate. Semiconductor "chips" comprising five or more levels of metallization are becoming more prevalent as device geometry's shrink to submicron levels.

A conductive plug filling a via hole is typically formed by depositing an interlayer dielectric on a conductive layer comprising at least one conductive pattern, forming an opening through the interlayer dielectric by conventional photolithographic and etching techniques, and filling the opening with a conductive material, such as tungsten (W). Excess conductive material on the surface of the interlayer dielectric is typically removed by chemical mechanical polishing (CMP). One such method is known as damascene and basically involves forming an opening in the interlayer dielectric and filling the opening with a metal. Dual damascene techniques involve forming an opening comprising a lower contact or via hole section in communication with an upper trench section, which opening is filled with a conductive material, typically a metal, to simultaneously form a conductive plug in electrical contact with a conductive line.

High performance microprocessor applications require rapid speed of semiconductor circuitry. The control speed of semiconductor circuitry varies inversely with the resistance and capacitance of the interconnection pattern. As integrated circuits become more complex and feature sizes and spacings become smaller, the integrated circuit speed becomes less dependent upon the transistor itself and more dependent upon the interconnection pattern. Miniaturization demands long interconnects having small contacts and small cross-sections. As the length of metal interconnects increases and cross-sectional areas and distances between interconnects decrease, the R×C delay caused by the interconnect wiring increases. If the interconnection node is routed over a considerable distance, e.g., hundreds of microns or more as in submicron technologies, the interconnection capacitance limits the circuit node capacitance loading and, hence, the circuit speed. As design rules are reduced to about 0.12 micron and below, the rejection rate due to integrated circuit speed delays significantly reduces production throughput and increases manufacturing costs. Moreover, as line widths decrease electrical conductivity and electromigration resistance become increasingly important.

Cu and Cu alloys have received considerable attention as a candidate for replacing Al in interconnect metallizations. Cu is relatively inexpensive, easy to process, and has a lower resistively than Al. In addition, Cu has improved electrical properties vis-à-vis W, making Cu a desirable metal for use as a conductive plug as well as conductive wiring.

An approach to forming Cu plugs and wiring comprises the use of damascene structures employing CMP. However, due to Cu diffusion through interdielectric layer materials, such as silicon dioxide, Cu interconnect structures must be encapsulated by a diffusion barrier layer. Typical diffusion barrier metals include tantalum (Ta), tantalum nitride (TaN), titanium nitride (TiN), titanium (Ti), titanium-tungsten (TiW), tungsten (W), tungsten nitride (WN), Ti—TiN, titanium silicon nitride (TiSiN), tungsten silicon nitride (WSiN), tantalum silicon nitride (TaSiN) and silicon nitride for encapsulating Cu. The use of such barrier materials to encapsulate Cu is not limited to the interface between Cu and the dielectric interlayer, but includes interfaces with other metals as well.

There are additional problems attendant upon conventional interconnect methodology. For example, as the feature size is reduced into the deep submicron range, the aspect ratio increases and voids are typically generated in the interconnects. Adverting to FIG. 1, an underlying feature, e.g., a metal line, is formed in dielectric layer 10 with a capping layer 12 thereon. Overlying dielectric layers 13 and 15 are formed with an intervening etch stop layer 14. A dual damascene structure is formed by etching an opening in dielectric layers 13 and 15, depositing a barrier metal layer 16, depositing Cu or a Cu alloy to fill the opening, and conducting CMP to form Cu line 17A in communication with underlying Cu via 17B electrically connected to underlying metal feature 11. A silicon nitride capping layer 18 is then deposited. Voids 19 are typically formed which adversely impact circuit reliability and decrease electromigration resistance. Such voids may stem from various sources, such as the manifest difficulty in completely filling openings having a reduced size, such as a via opening of about 0.21 to about 0.23 micron.

As design rules extend deeper into the submicron range, the reliability of interconnect patterns becomes particularly critical and electromigration becomes increasingly problematic. Accordingly, there exists a continuing need for methodology enabling the formation of encapsulated Cu and Cu alloy interconnects for vertical metallization levels with greater accuracy, improved reliability, increased electromigration resistance and reduced contact resistance. There exists a particular continuing need for methodology enabling the formation of Cu or Cu alloy dual damascene structures formed in dielectric material having a low dielectric constant (k), with improved reliability and electromigration resistance and reduced contact resistance.

DISCLOSURE OF THE INVENTION

An advantage of the present invention is a method of manufacturing a semiconductor device having highly reliable Cu or Cu alloy interconnects with improved electromigration resistance and reduced contact resistance.

Additional advantages and other features of the present invention will be set forth in the description which follows and, in part, will become apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method of manufacturing a semiconductor device, the method comprising: forming an opening in a dielectric layer; depositing Cu or a Cu alloy to fill the opening; and laser thermal annealing the deposited Cu or Cu alloy in ammonia ($NH_3$).

Embodiments of the present invention comprise laser thermal annealing by impinging a pulsed laser light beam on the deposited Cu or Cu alloy at a radiant fluence of about 0.28 to about 0.34 joules/cm$^2$, employing an $NH_3$ flow rate of about 200 to about 2,000 sccm, to elevate the temperature of the deposited Cu or Cu alloy to about 983° C. to about 1183° C., thereby reflowing the deposited Cu or Cu alloy and eliminating voids. The use of $NH_3$ during laser thermal annealing advantageously reduces copper oxide prior to and during reflowing, thereby decreasing contact resistance and improving device reliability.

Embodiments of the present invention include planarizing by conducting CMP subsequent to laser thermal annealing leaving an exposed Cu or Cu alloy surface substantially co-planar with the upper surface of the dielectric layer, treating the exposed Cu or Cu alloy surface in a plasma containing $NH_3$ to remove copper oxide therefrom and then depositing a silicon nitride capping layer by plasma enhanced chemical vapor deposition (PECVD) on the plasma treated surface.

Embodiments of the present invention further include single and dual damascene techniques comprising forming an opening in one or more interlayer dielectrics on a wafer, depositing an underlying diffusion barrier layer, such as a composite comprising a tantalum nitride layer lining the opening and a layer of alpha-tantalum ($\alpha$-Ta) on the tantalum nitride layer. A seedlayer can then be deposited. A Cu or a Cu alloy layer is then deposited filling the opening. Laser thermal annealing in $NH_3$ is then conducted to reduce copper oxide and reflow the deposited Cu or Cu alloy to eliminate voids. CMP is then conducted to remove the Cu or Cu alloy layer beyond the opening leaving an exposed surface oxidized. The wafer is then conveyed into a chamber wherein the exposed surface of the Cu or Cu alloy layer is treated with a plasma in $NH_3$ to remove any copper oxide formed during CMP. Silane ($SiH_4$) is then introduced and a silicon nitride capping layer is deposited on the plasma treated surface by PECVD.

Additional advantages of the present invention will become readily apparent to those skilled in this art from the following detailed description, wherein embodiments of the present invention are described, simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

DESCRIPTION OF THE INVENTION

Figure 1:
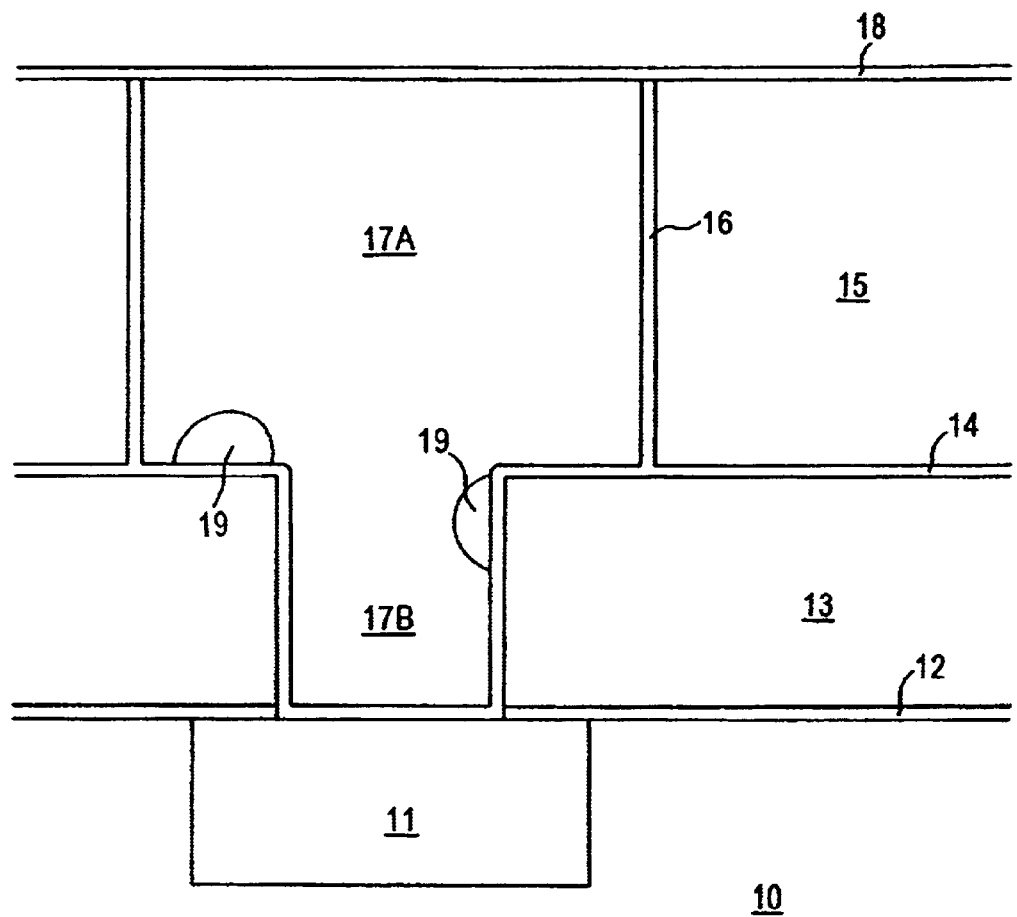
FIG. 1 schematically illustrates the formation of voids in Cu interconnects.

The present invention addresses and solves the voiding problem attendant upon forming submicron Cu or Cu alloy interconnects, thereby improving device reliability and electromigration performance while reducing contact resistance. As employed throughout this application, the symbol Cu is intended to encompass high purity elemental copper as well as Cu-based alloys, such as Cu alloys containing minor amounts of tantalum, indium, tin, zinc, manganese, titanium, magnesium, chromium, titanium, germanium, strontium, platinum, magnesium, aluminum or zirconium.

As design rules are scaled down into the deep submicron range, such as about 0.12 micron and under, it becomes increasingly difficult to completely fill openings in dielectric layers with metal, such as single and dual damascene openings with Cu, without the generation of voids. In copending application Ser. No. 09/894,167 filed on Jun. 27, 2001, the Cu voiding problem was addressed by laser thermal annealing the deposited Cu. The present invention constitutes a further improvement or refinement over such methodology by conducting laser thermal annealing in $NH_3$, thereby advantageously reducing copper oxide prior to and during reflowing of the deposited Cu with an attendant reduction in contact resistance. It is believed that during laser thermal annealing, $NH_3$ disassociates into nitrogen and hydrogen. The released hydrogen reduces the copper oxide, thereby providing a substantially homogeneous interconnect with reduced contact resistance.

In accordance with embodiments of the present invention, the deposited Cu is subjected to laser thermal annealing by impinging a pulsed laser light beam thereon, employing a $NH_3$ flow rate of about 200 to about 2,000 sccm, at a radiant fluence of about 0.28 to about 0.34 joules/cm$^2$ for a brief period of time, e.g., about 10 to about 100 nanoseconds. During laser thermal annealing copper oxide is reduced and the deposited Cu is elevated to a temperature of about 983° C. to about 1183° C. at which the deposited Cu reflows thereby eliminating voids.

Subsequently, CMP is conducted so that the upper surface of the deposited Cu is substantially flush with the upper surface of the dielectric layer. As a result of CMP, troublesome copper oxide is typically formed preventing adequate adhesion to a subsequently deposited capping layer. Accordingly, embodiments of the present invention include treating be exposed to Cu surface after CMP with a plasma containing $NH_3$ to remove copper oxide therefrom, and then depositing a silicon nitride capping layer on the plasma treated surface by PECVD.

The use of laser thermal annealing in accordance with embodiments of the present invention to reduce interconnect voiding and to decrease contact resistance offers several advantages. For example, laser thermal annealing enables pinpoint accuracy in targeting the exposed surfaces of the inlaid Cu, thereby avoiding unnecessarily elevating the temperature of other portions of the wafer causing various problems, such as dopant impurity diffusion issues.

In implementing embodiments of the present invention, any of various commercially available laser tools may be employed, such as those utilizing a laser source capable of operating at energies of about 10 to about 2,000 mJ/cm$^2$/pulse, e.g., about 100 to about 400 mJ/cm$^2$/pulse. Commercially available tools exist which can perform such laser annealing, either with or without mask. The Verdant Technologies laser anneal tool is but an example and operates at an exposure wavelength of 308 nm.

Cu interconnects formed in accordance with embodiments of the present invention can be, but are not limited to, interconnects formed by damascene technology. Thus, embodiments of the present invention include forming an interlayer dielectric overlying a substrate, forming an opening, e.g., a damascene opening, in the interlayer dielectric, forming a composite diffusion barrier layer comprising an initially deposited tantalum nitride layer and a layer of α-Ta on the titanium nitride layer, and filling the opening with Cu. Advantageously, the opening in the interlayer dielectric can be filled by initially depositing a seed layer and then electroplating or electrolessly plating the Cu. Typical seedlayers include Cu alloys containing magnesium, aluminum, zinc, zirconium, tin, nickel, palladium, silver or gold in a suitable amount, e.g., about 0.3 to about 12 at. %. The deposited Cu is then subjected to laser thermal annealing in $NH_3$ to reduce any copper oxide thereby reducing contact resistance and to reflow the deposited Cu thereby eliminating voids. CMP is then performed such that the upper surface of the inlaid Cu is substantially coplanar with the upper surface of the interlayer dielectric. As a result of CMP, a thin film of copper oxide is typically formed. The exposed oxidized surface of the Cu is then treated with a plasma in $NH_3$ to remove such copper oxide and a silicon nitride capping layer is deposited by PECVD.

In accordance with embodiments of the present invention, the damascene opening can also be filled with Cu by PVD at a temperature of about 50° C. to about 150° C. or by CVD at a temperature under about 200° C. In various embodiments of the present invention, conventional substrates and interlayer dielectrics, can be employed. For example, the substrate can be doped monocrystalline silicon or gallium-arsenide. The interlayer dielectric employed in the present invention can comprise any dielectric material conventionally employed in the manufacture of semiconductor devices. For example, dielectric materials such as silicon dioxide, phosphorous-doped silicate-glass (PSG), boron-and phosphorus doped silicate glass (BPSG), and silicon dioxide derived from tetraethylorthosilicate (TEOS) or silane by PECVD can be employed. The openings formed in dielectric layers are effected by conventional photolithographic and etching techniques.

Advantageously, dielectric materials for use as interlayer dielectrics in accordance with embodiments of the present invention can comprise dielectric materials with lower values of permitivity and those mentioned above, in order to reduce interconnect capacitance. The expression "low-k" material has evolved characterized materials with a dielectric constant less than about 3.9, e.g., about 3.5 or less. The value of a dielectric constant expressed herein is based upon the value of (1) for a vacuum.

A wide variety of low-k materials can be employed in accordance with embodiments of the present invention, both organic and inorganic. Suitable organic materials include various polyimides and BCB. Other suitable low-k dielectrics include poly(arylene)ethers, poly(arylene)ether azoles, parylene-N, polyimides, polynapthalene-N, polyphenylquinoxalines (PPQ), polyphenyleneoxide, polyethylene and polypropylene. Other low-k materials suitable for use in embodiments of the present invention include $FO_x$™ (HSQ-based), XLK™ (HSQ-based), and porous SILK™, an aromatic hydrocarbon polymer (each available from Dow Chemical Co., Midland, Mich.); Coral™, a carbon-doped silicon oxide (available from Novellus Systems, San Jose, Calif.), silicon-carbon-oxygen-hydrogen (SiCOH) organic dielectrics, Black-Diamond™ dielectrics, Flare™, an organic polymer, HOSP™, a hybrid sioloxane-organic polymer, and Nanoglass™, a nanoporous silica (each available from Honeywell Electronic Materials) and halogen-doped (e.g., fluorine-doped) silicon dioxide derived from tetraethyl orthosilicate (TEOS) and fluorine-doped silicate glass (FSG).

Figure 2:
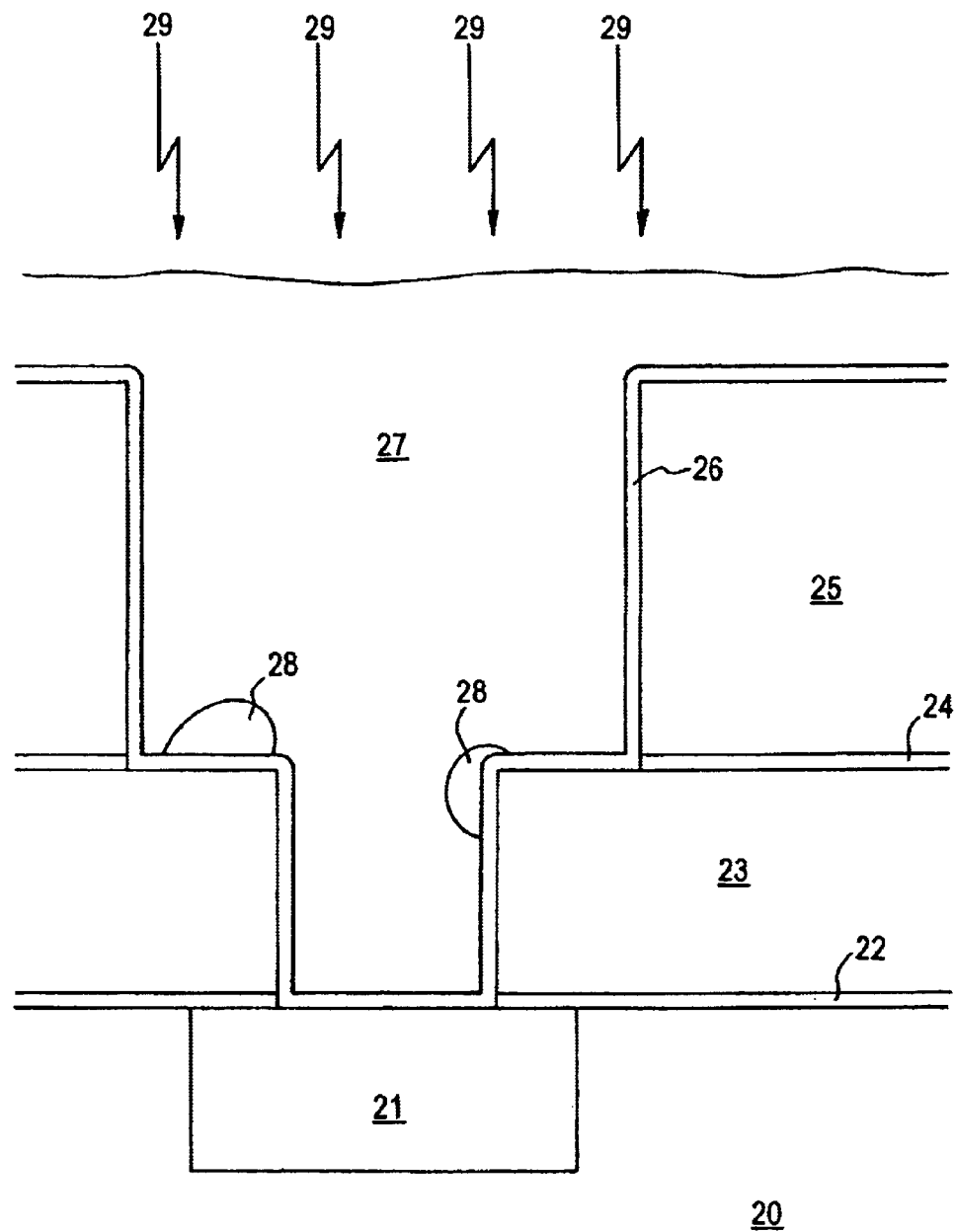
FIGS. 2–4 schematically illustrate sequential phases of a method in accordance with an embodiment of the present invention, wherein similar features or elements are denoted by like reference characters.
Figure 3:
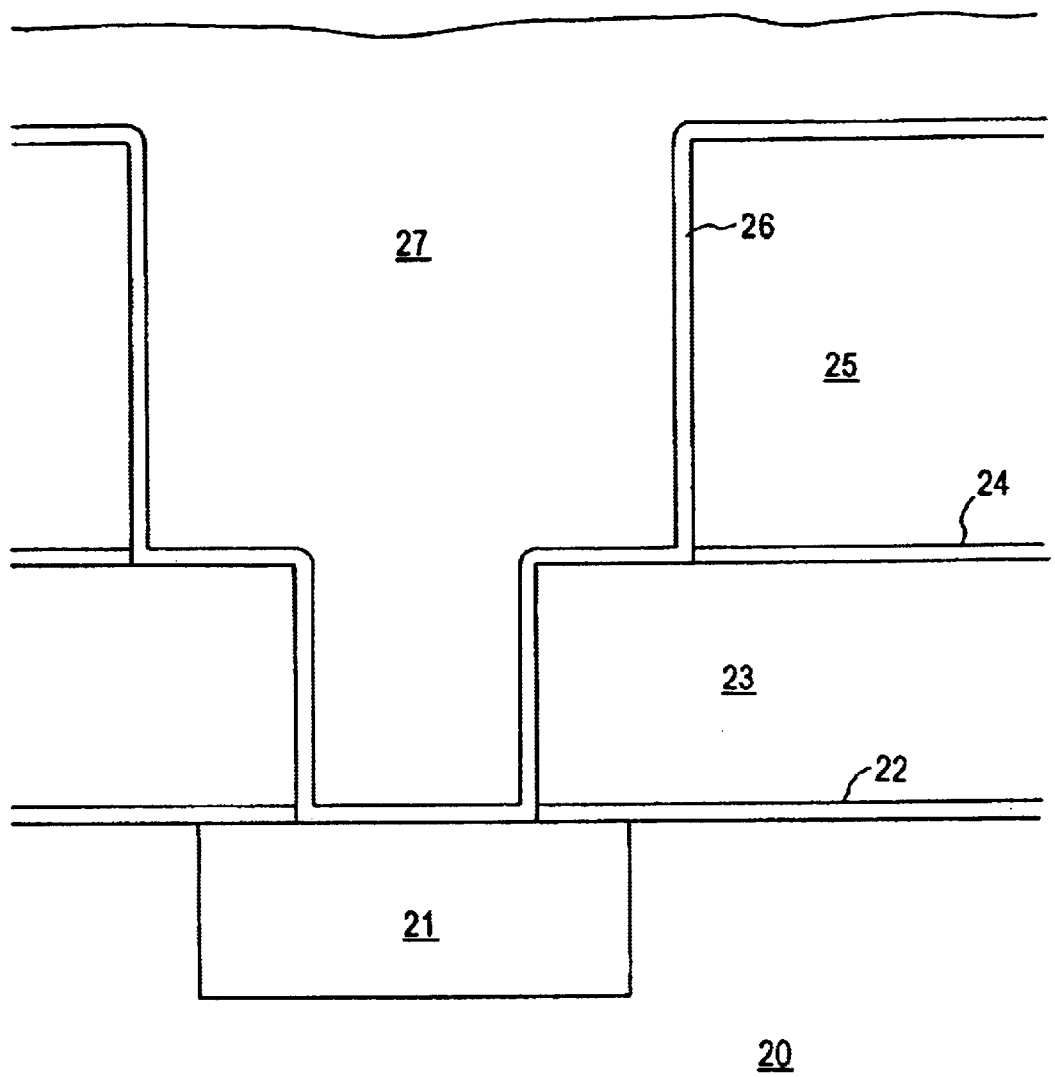
Figure 4:
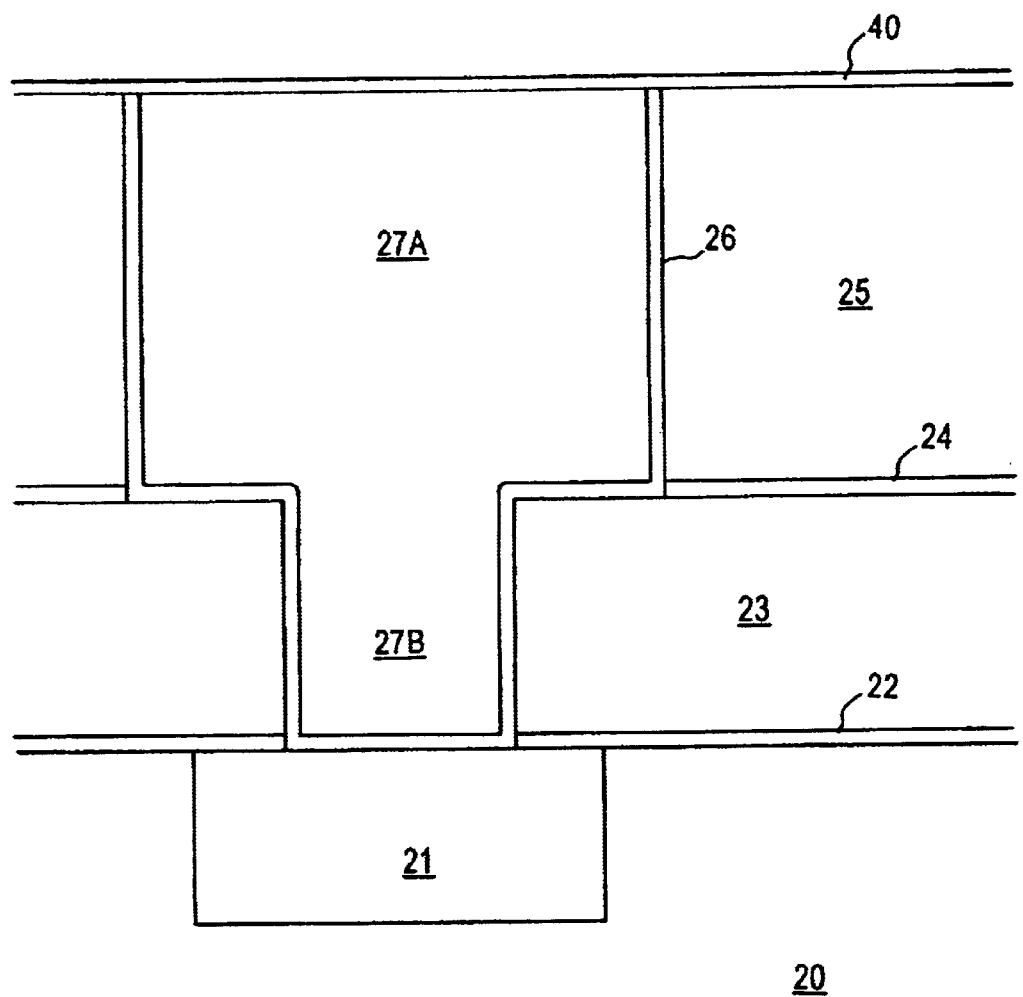

An embodiment of the present invention is schematically illustrated in FIGS. 2 through 4. Adverting to FIG. 2, a lower metal feature at 21, e.g., a Cu line, is formed in underlying dielectric layer 20, e.g., a low-k dielectric layer. A silicon nitride or silicon carbide capping layer 22 is then formed followed by the sequential formation of dielectric layer 23, silicon nitride or silicon carbide etch stop layer 24, and dielectric layer 25. Dielectric layers 23 and 25 can comprise low-k dielectric materials such as a F-containing silicon oxide, e.g., a F-containing silicon oxide derived from F-doped tetraethyl orthosilicate (F-TEOS). A composite barrier layer 26 comprising an initial tantalum nitride layer and a layer of α-Ta thereon is then deposited to line the opening. A seedlayer (not shown) can be deposited. Cu 27 is then deposited to fill the dual damascene opening and form an overburden. The resulting Cu interconnect contains voids 28 which adversely impact device reliability and electromigration performance. During Cu deposition, some copper oxide also forms. As shown in FIG. 2, the deposited Cu 27 is subjected to laser thermal annealing by impinging a pulsed laser light beam, schematically illustrated by arrows 29, in flowing $NH_3$. Advantageously, the use of $NH_3$ reduces copper oxide thereby reducing contact resistance, while the pulsed laser beam elevates the temperature of the deposited Cu 27 causing melting and reflowing to eliminate the voids 28. The resulting structure after laser thermal annealing is schematically illustrated in FIG. 3.

Subsequently, CMP is conducted, the exposed Cu surface is plasma treated in $NH_3$ and a silicon nitride capping layer 40 is deposited as shown in FIG. 4. The resulting Cu interconnect structure comprises Cu line 27A in communication with underlying Cu via 27B which is in electrical contact with the underlying metal feature 21.

Advantageously, the inventive methodology enables the fabrication of semiconductor devices having feature sizes in the deep submicron regime with reliable Cu interconnects exhibiting reduced contact resistance and improved electromigration performance. The use of laser thermal annealing in $NH_3$ prior to CMP advantageously reduces copper oxide thereby reducing contact resistance and causes reflowing of the deposited Cu to eliminate voids resulting in a substantially uniformly filled opening exhibiting improved device reliability, reduced electromigration failures and increased circuit speed.

The present invention enjoys industrial applicability in the formation of various types of inlaid Cu metallization interconnection patterns. The present invention is particularly applicable to manufacturing semiconductor devices having submicron features and high aspect ratio openings.

In the previous description, numerous specific details are set forth, such as specific materials, structures, chemicals, processes, etc., to provide a better understanding of the present invention. However, the present invention can be practiced without resorting to the details specifically set forth. In other instances, well known processing and materials have not been described in detail in order not to unnecessarily obscure the present invention.

Only the preferred embodiment of the present invention and but a few examples of its versatility are shown and described in the present invention. It is to be understood that the present invention is capable of use in various other combinations and environments and is capable of changes or modifications within the scope of the inventive concept as expressed herein.

What is claimed is:

1. A method of manufacturing a semiconductor device, the method comprising:

forming an opening in a dielectric layer;

depositing copper (Cu) or a Cu alloy to fill the opening; and laser thermal annealing the deposited Cu or Cu alloy in ammonia ($NH_3$) to reflow the deposited Cu or Cu alloy.

2. The method according to claim 1, comprising laser thermal annealing by impinging a pulsed laser light beam on the deposited Cu or Cu alloy at a radiant fluence of about 0.28 to about 0.34 joules/$cm_2$.

3. The method according to claim 2, comprising laser thermal annealing to heat the deposited Cu or Cu alloy to a temperature of about 983° C. to about 1183° C., thereby reflowing the deposited Cu or Cu alloy.

4. The method according to claim 1, comprising laser thermal annealing employing an $NH_3$ flow rate of about 200 to about 2,000 sccm.

5. The method according to claim 1, comprising depositing a barrier layer lining the opening before depositing the Cu or Cu alloy.

6. The method according to claim 5, wherein the barrier layer is a composite comprising a tantalum nitride layer on the dielectric layer, a layer of alpha-tantalum (α-Ta) on the tantalum nitride layer.

7. The method according to claim 5, comprising depositing a seedlayer on the barrier layer.

8. The method according to claim 7, comprising depositing the Cu or Cu alloy by electroless plating or electroplating.

9. The method according to claim 6, comprising conducting chemical mechanical polishing (CMP) such that an upper surface of the deposited Cu or Cu alloy is substantially co-planar with an upper surface of the dielectric layer.

10. The method according to claim 9, comprising:

treating the upper surface of the Cu or Cu alloy in a plasma containing $NH_3$ to remove copper oxide therefrom; and depositing a silicon nitride capping layer on the plasma treated surface by plasma enhanced chemical vapor deposition.

11. The method according to claim 1, comprising conducting chemical mechanical polishing (CMP) such that an upper surface of the deposited Cu or Cu alloy is substantially co-planar with an upper surface of the dielectric layer.

12. The method according to claim 11, comprising:

treating the upper surface of the Cu or Cu alloy in a plasma containing $NH_3$ to remove copper oxide therefrom; and depositing a silicon nitride capping layer on the plasma treated surface by plasma enhanced chemical vapor deposition.

13. The method according to claim 1, wherein the opening is a dual damascene opening containing a lower via hole section in communication with an upper trench section, the method comprising depositing the Cu or Cu alloy to fill the opening to form an upper line in communication with an underlying via.

14. The method according to claim 13, wherein the dielectric layer comprises an oxide.

15. The method according to claim 14, where the oxide is a fluorine-containing silicon oxide derived from fluorine-doped tetraethyl orthosilicate.

\* \* \* \* \*